United States Patent [19]

Miyabayashi

[11] Patent Number: 5,073,684

[45] Date of Patent: Dec. 17, 1991

[54] SHEET TYPE STORAGE BATTERY AND PRINTED WIRING BOARD CONTAINING THE SAME

[75] Inventor: Takeshi Miyabayashi, Nagoya, Japan

[73] Assignee: Brother Kogyo Kabushiki Kaisha, Nagoya, Japan

[21] Appl. No.: 625,102

[22] Filed: Dec. 10, 1990

Related U.S. Application Data

[62] Division of Ser. No. 425,952, Oct. 24, 1989, Pat. No. 5,019,468.

[30] Foreign Application Priority Data

| Oct. 27, 1988 | [JP] | Japan | 63-271792 |
| Oct. 28, 1988 | [JP] | Japan | 63-274251 |
| Oct. 31, 1988 | [JP] | Japan | 63-274776 |
| Oct. 31, 1988 | [JP] | Japan | 63-274778 |

[51] Int. Cl.$^5$ ............................................. H05K 1/00
[52] U.S. Cl. ................................... 174/260; 174/255; 429/127; 429/192
[58] Field of Search ............... 174/260, 250, 255; 429/8, 124, 127, 191, 192

[56] References Cited

U.S. PATENT DOCUMENTS

| 2,933,547 | 5/1960 | Grubb | 429/192 |
| 3,674,562 | 7/1972 | Schneider et al. | 429/192 |
| 4,303,748 | 12/1981 | Armand et al. | 429/192 |
| 4,737,422 | 4/1988 | Knight et al. | 429/192 |
| 4,749,875 | 6/1988 | Hara | 429/127 X |
| 4,777,563 | 10/1988 | Teraoka et al. | 361/395 |
| 4,789,610 | 12/1988 | Kondo et al. | 429/191 |
| 4,925,752 | 5/1990 | Fauteux et al. | 429/191 |

FOREIGN PATENT DOCUMENTS 68558  4/1985  Japan ................................. 429/124

Primary Examiner—Morris H. Nimmo
Attorney, Agent, or Firm—Oliff & Berridge

[57] ABSTRACT

A sheet type storage battery and a printed wiring board containing the sheet type storage battery. The sheet type storage battery comprises a negative electrode, a solid electrolyte layer, a positive electrode layer which are laminated in this order, and a thermoplastic resin film laminated on at least one of the surfaces of said positive and negative electrode layers, which is extendible and weldable by an ultrasonic welding operation. The printed wiring board includes a base plate comprising at least one sheet type storage battery having a negative electrode layer, a positive electrode layer and a solid electrolyte layer sandwiched between the positive and negative electrode layers, preimpregnation plates laminated on both surfaces of the base plate, and holes having the inner walls coated with copper coating and formed in the printed wiring board for electrically connecting the positive and negative electrode layers to the circuit elements provided on the printed wiring board.

12 Claims, 5 Drawing Sheets

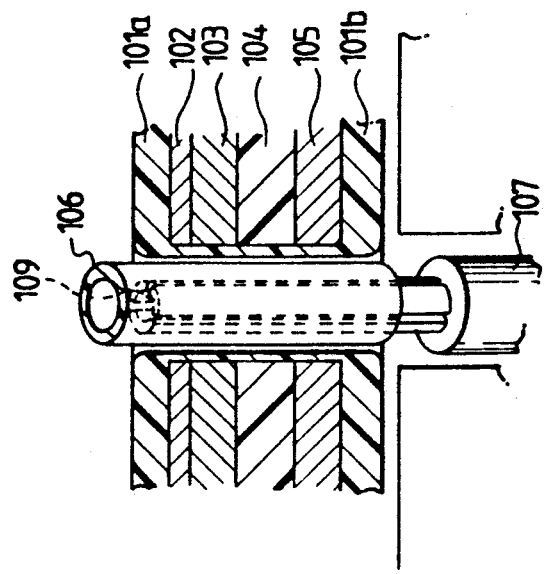
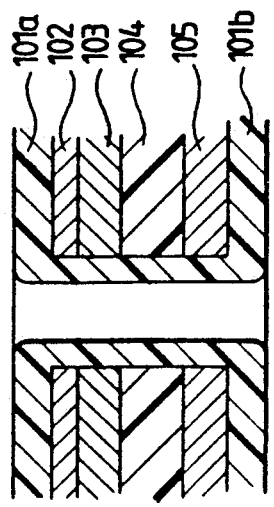
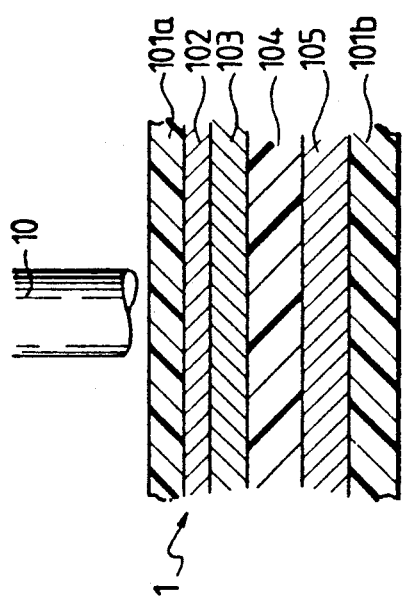
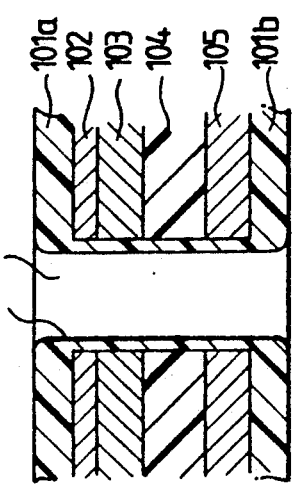
FIG. 1
FIG. 2
FIG. 3
FIG. 4

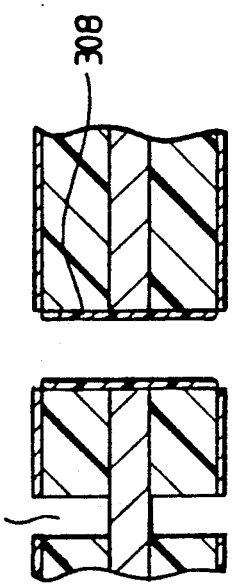
FIG. 5A
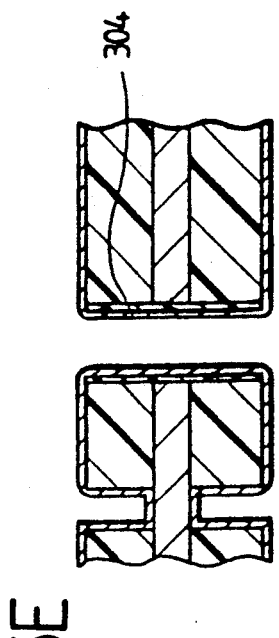
FIG. 5B
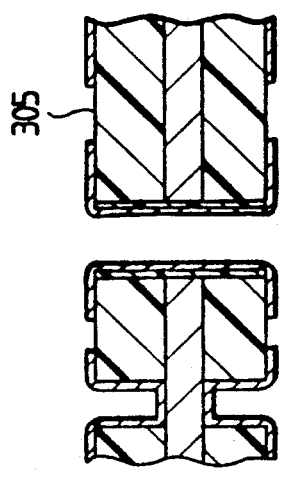
FIG. 5D
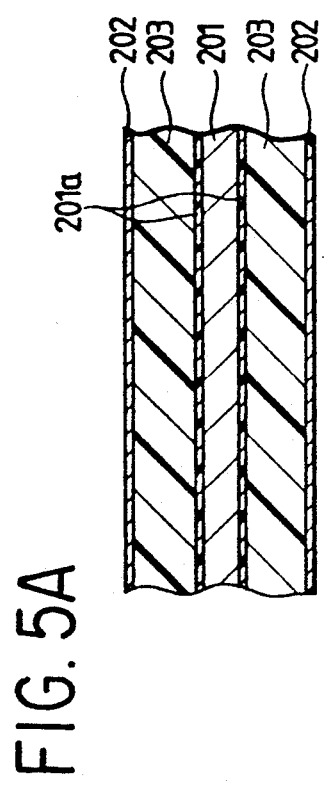
FIG. 5C
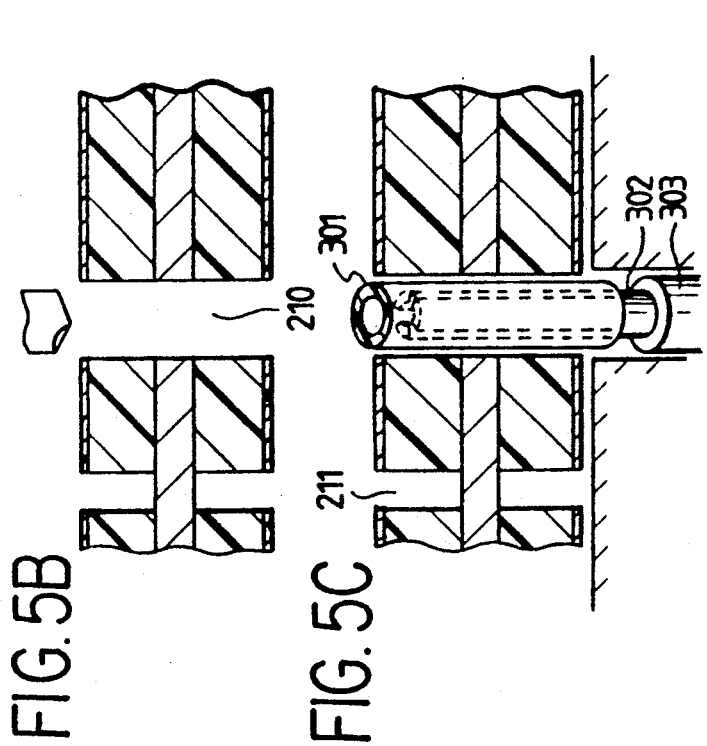
FIG. 5E
FIG. 5F

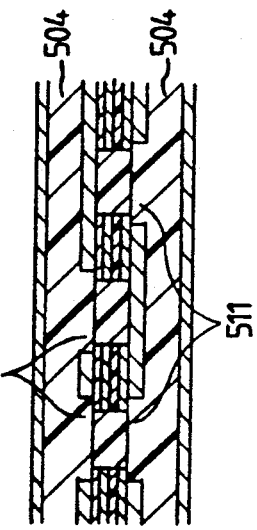
FIG. 7F
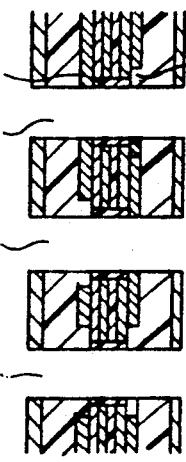
FIG. 7G
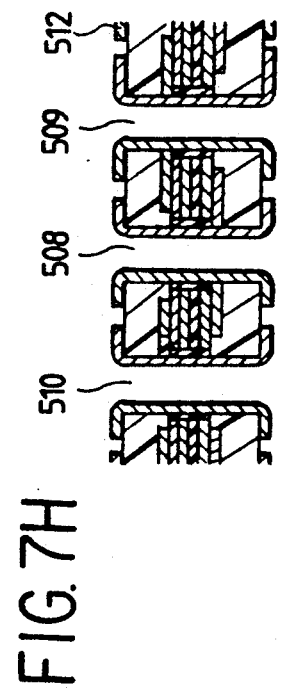
FIG. 7H
FIG. 7A
FIG. 7B
FIG. 7C
FIG. 7D
FIG. 7E
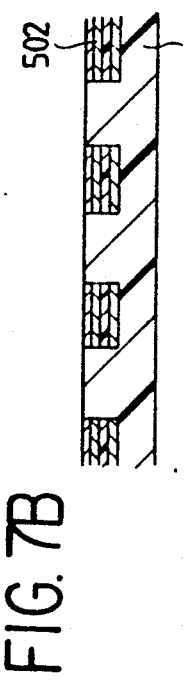
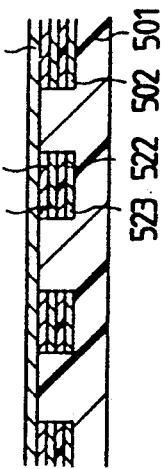
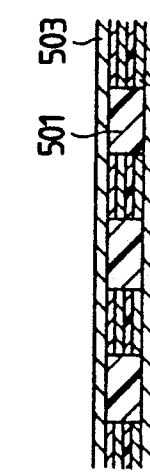
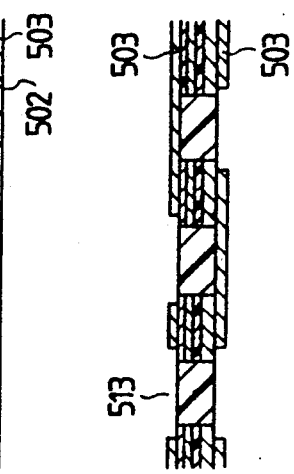

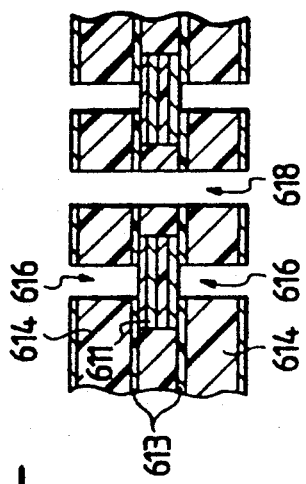
FIG. 9A
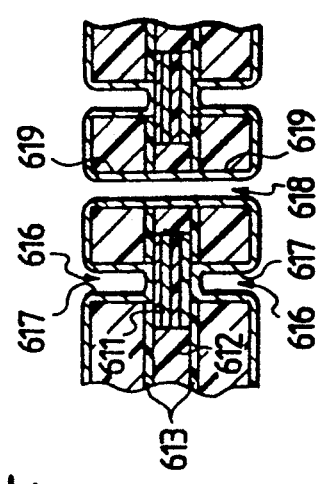
FIG. 9B
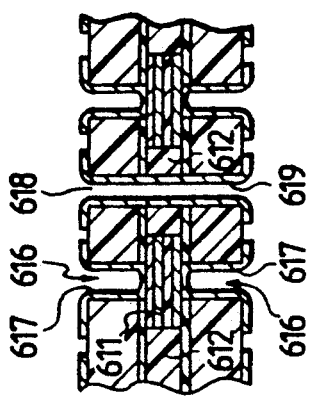
FIG. 9C
FIG. 9D
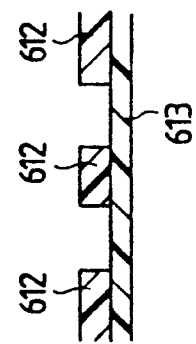
FIG. 9E
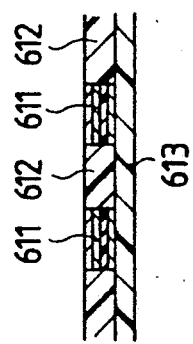
FIG. 9F
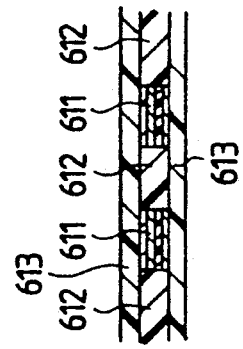
FIG. 9G

SHEET TYPE STORAGE BATTERY AND PRINTED WIRING BOARD CONTAINING THE SAME

This is a division of application Ser. No. 425,952, filed Oct. 24, 1989, now U.S. Pat. No. 5,019,468.

BACKGROUND OF THE INVENTION

This invention relates to a sheet type storage battery and a printed wiring board containing the storage battery.

A storage battery has been conventionally used as a main power source for a printed circuit board including low power consuming elements such as C-MOS IC and so on, or as an auxiliary power source for memory backup. Such a conventional battery comprises a rigid one of a cylinder type, button type, coin type, flat type, or box type. Accordingly, the conventional battery has disadvantages that it is difficult to process or shape a battery after the battery has been produced first because a packing material, an electrode material and an electrolyte for the battery and the battery shape itself are unsuitable for the processing and shaping, and the size of the battery is too large to be miniaturized. Further, when the battery is used as a power source for the printed circuit board, wiring patterns (lines) for the power source are required to be printed on the circuit board such that the lines surround the low power consuming elements. This causes each of the elements to have a higher impedance and therefore noises are liable to appear on the lines for the power source. Those noises cause faulty operation to easily occur in the circuit board.

SUMMARY OF THE INVENTION

An object of this invention is to provide a sheet type storage battery which is easily processed or shaped after the battery is produced.

Another object of this invention is to provide a method for forming a throughhole in the sheet type storage battery.

Still another object of this invention is to provide a printed wiring board containing the sheet type storage battery which is miniaturized and eliminates the occurrence of the noises.

According to one aspect of this invention, a sheet type storage battery comprises a negative electrode layer, a solid electrolyte layer, a positive electrode layer, those layers being laminated in this order, and a thermoplastic resin film laminated on at least one of the surfaces of the positive and negative electrode layers.

According to another aspect of this invention, a method for forming a throughhole in the sheet type storage battery comprising a negative electrode layer, a solid electrode layer, a positive electrode layer and a thermoplastic resin film laminated on at least one of the surfaces of the positive and negative electrode layers, comprises the steps of forming a throughhole in the sheet type storage battery by a drill or punching processing, coating the inner wall of the throughhole with the thermoplastic resin film by an extendible property of the thermoplastic resin film, inserting a cylindrical hollow thermoplastic resin into the throughhole and inserting the ultrasonic horn of an ultrasonic welder into the cylindrical hollow thermoplastic resin by a welding operation of the ultrasonic welder.

Still another aspect of this invention, a printed wiring board containing the sheet type storage includes a base plate comprising a sheet type storage battery which comprises a negative electrode layer, a positive electrode layer and a solid electrolyte layer sandwiched between the negative and positive electrode layers.

BRIEF DESCRIPTION OF THE DRAWINGS

FIG. 1 is a cross sectional view of one embodiment of a sheet type storage battery according to this invention;

FIG. 2 is a cross sectional view of the sheet type storage battery as shown in FIG. 1 when a throughhole is formed in the battery;

FIG. 3 is a cross sectional view of the sheet type storage battery as shown in FIG. 1 when a cylindrical hollow resin is inserted into the throughhole and further an ultrasonic horn for the ultrasonic welding is inserted into the cylindrical hollow resin;

FIG. 4 is a cross sectional view of the sheet type storage battery as shown in FIG. 1 after the cylindrical hollow resin is welded to the inner wall of the throughhole by the ultrasonic welding;

FIGS. 5A–5F provide a schematic diagram of a method for producing one embodiment of the printed wiring board containing the sheet type storage battery;

FIGS. 7A–7H provide a schematic diagram of a method for producing another embodiment of the printed wiring board containing the sheet type storage battery;

FIGS. 9A–9G provide a schematic diagram of a method for producing the printed wiring board as shown in FIG. 8.

DETAILED DESCRIPTION OF THE INVENTION

Figure 6:
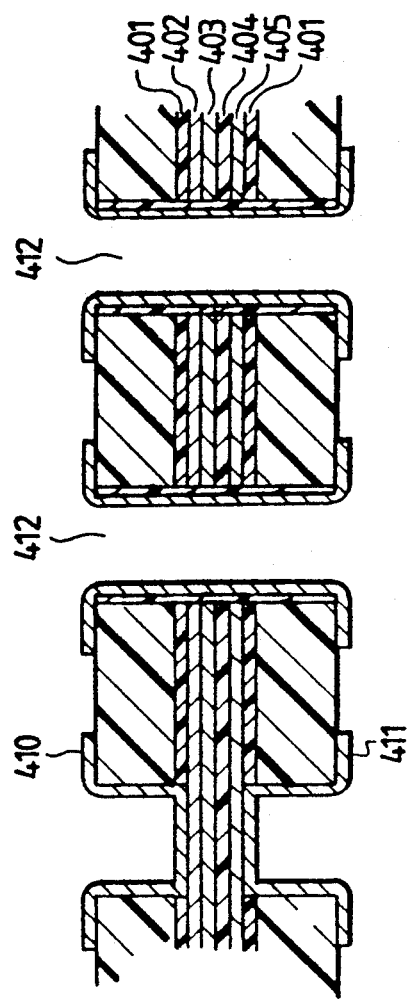
FIG. 6 is a cross sectional view of the printed wiring board as produced using the method portrayed in FIGS. 5A–5F.

The preferred embodiments of this invention will be described hereunder with reference to the accompanying drawings.

FIG. 1 is a cross sectional view of one embodiment of a sheet type storage battery according to this invention. In this embodiment, a sheet type storage battery 1 includes a negative electrode layer 105, a solid electrolyte layer 104, a positive electrode layer 103, and a collector layer 102 which are laminated in this order. The sheet type storage battery further includes two thermoplastic films 101a and 101b which are extendible and can be welded by ultrasonic wave. The thermoplastic films 101a and 101b are laminated on the negative electrode layer 105 and the collector layer 102, respectively. The positive electrode layer 103 comprises a composite material such as $V_6O_{13}$, the solid electrolyte layer 104 comprises a solid type of polymer electrolyte, the negative electrode layer 105 comprises a metal foil of Li-Al and the collector layer 102 comprises a metal foil of Ni. The thermoplastic resin film comprises polyethylene, polystyrene, polyamide resin, phenol resin, epoxy resin or the like.

The sheet type storage battery thus constructed can be easily punched by a drill 10 (or a punch) as shown in FIGS. 1 and 2, and therefore it can be easily processed without loss of its battery property after it is produced. After punching by the drill or the like, a thin resin film 108 of thermoplastic resin is formed at the inner wall of a throughhole in the battery. As shown in FIG. 3, a cylindrical hollow thermoplastic resin 106 having the substantially same outer diameter as the throughhole or a smaller outer diameter than the throughhole is inserted into the throughhole whose inner wall is covered with the thin resin film 108, and then an ultrasonic horn 109 of an ultrasonic welder 107 which is extendible in diameter by welding operation is further inserted into the cylindrical thermoplastic resin 106. Accordingly, when an ultrasonic welding operation is carried out while the ultrasonic horn 109 is pulled out of the cylindrical hollow thermoplastic resin 106, the resin film 108 formed at the inner wall of the throughhole by punching the battery, the resin films 101a and 101b laminated at the both surfaces of the sheet type storage battery and the cylindrical resin 106 are welded with one another and the throughhole of the battery is sealed as shown in FIG. 4 so that the insulation state is maintained.

According to the sheet type storage battery of this embodiment, a throughhole can be formed at any position of the battery after the battery is produced, and the inner wall of the throughhole is completely sealed so that the insulation is completely maintained. Accordingly, it is possible to easily provide the battery thus produced to an electrical equipment, a printed circuit board and so on with a binding screw or the like.

As described above, a sheet type storage battery of this invention is thin and flexible, and can be easily processed after it is produced. Accordingly, this kind of storage battery can be inserted into a printed wiring board as a power source. This enables the printed wiring board itself to be miniaturized and faulty operation to be reduced.

FIGS. 5A–5E show schematically a method for producing a first embodiment of the printed wiring board containing a sheet type storage battery therein. The sheet type storage battery used in this embodiment has substantially the same structure as that in FIG. 1. That is, the sheet type storage battery 201 includes a positive electrode layer comprising a composite material of $V_6O_{13}$ or the like, a solid electrolyte layer comprising a polymer electrolyte, a negative electrode layer comprising a metal foil of Li or Li-Al, and a collector layer comprising a metal foil of Ni which is laminated on the positive electrode layer. The sheet type storage battery thus constructed can be punched by a drill or the like and can be thermally attachable under pressure. This kind of storage battery itself is disclosed in Japanese Utility Model No. 57435/88, and therefore the detailed description thereof is eliminated.

In FIGS. 5A–5F the sheet type storage battery 201 is coated with thermoplastic resin films 201a at both surfaces of the battery and thermally attached thereto under the pressure. Each of the thermoplastic resin films comprises polyethylene, polystyrene, polyamide resin, phenol resin or epoxy resin.

At a first stage, the sheet type storage battery thus constructed is sandwiched between laminated preimpregnation plates (hereinafter referred to as "prepreg") 203 each of which is coated with copper 202 at one surface thereof, and then is thermally fixed to the laminated plates under pressure, whereby a wiring board as shown in FIG. 5A is formed. At a second stage, as shown in FIG. 5B, throughholes 210 and blind throughholes 211 for electrode terminals for charging and for power supply are formed at any position of the wiring board by a jigbowler or a press. At a third stage, as shown in FIG. 5C, a cylindrical hollow thermoplastic resin 301 having a smaller diameter than that of the throughhole is inserted into the throughhole, and then an ultrasonic horn 302 of an ultrasonic welder 303 which is extendible in diameter by the ultrasonic welding operation is inserted into the cylindrical hollow thermoplastic resin 301. As described above, the ultrasonic welding operation is carried out while the ultrasonic horn 302 is pulled out of the cylindrical hollow thermoplastic resin 301, so that the inner wall of the throughhole is coated with the thermoplastic resin 308 as shown in FIG. 5D. At a fourth stage, the wiring board is immersed in an acid solution and then in an alkali solution to clean the holes and the throughholes. In this case, the thermoplastic resin 201a disposed at the bottoms of the blind throughholes 211 is removed from the sheet type storage battery. At a fifth stage, the wiring board is immersed in a seeder bath such as $PdCl_4$, $SnCl_2$, or the like, and then a copper coating 304 as shown in FIG. 5E, is formed in the blind throughholes 211 and the throughholes 210 by an electroless copper plating or a copper electroplating. At a final stage, as shown in FIG. 5F wiring patterns 305 for a signal circuit are formed by a photolithography technique or an etching technique.

FIG. 6 is a cross sectional view of the printed wiring board containing the sheet type storage battery which is produced by the method as shown in FIGS. 5A–5F. A positive electrode terminal 410 for power supply is fixed to the collector layer 402 of Ni foil by the plating method, and a negative electrode terminal 411 for power supply is also fixed to the negative electrode layer 405 by the plating method. Each of those positive and negative electrode terminals 410 and 411 is electrically connected to an electrode portion of each circuit element. Accordingly, the wiring of long electrode lines is not required to supply an electric power to each of the circuit elements, and therefore the printed wiring board containing the sheet type storage battery can be miniaturized and faulty operation due to noises can be reduced.

FIGS. 7A–7H schematically present a method for producing a second embodiment of the printed wiring board containing the sheet type storage battery.

The sheet type storage battery used in this embodiment has substantially same structure as the first embodiment. That is, the sheet type storage battery includes a positive electrode layer 521 comprising a composite material of $V_6O_{13}$ or the like, a solid electrolyte layer 522 comprising a polymer electrolyte, a negative electrode layer 523 comprising a metal foil of Li or Li-Al, and a collector layer 520 comprising a metal foil of Ni which is laminated on the positive electrode layer. The sheet type storage battery thus constructed can be punched by a drill or the like and is thermally attachable under pressure. This kind of storage battery itself is disclosed in Japanese Utility Model No. 57435/88, and therefore the detailed description thereof is eliminated.

The method for producing the printed wiring board containing the sheet type storage battery of this embodiment will be described hereunder.

At a first stage, a spacer 501 comprising phenol resin or epoxy resin is combined with a sheet type storage battery 502 having throughholes formed therein, as shown in FIGS. 7A and 7B. At a second stage, a copper foil 503 is attached to the upper surface of a collector layer 520 of Ni foil under pressure as shown in FIG. 7C. At a third stage, the lower surface of the spacer 501 is polished until negative electrode layers 523 of the battery are exposed, and then another copper foil 503 is attached to the polished surface under pressure as shown in FIG. 7D. At a fourth stage, the copper foils 503 are patterned by the photolithography technique or the like at the positions where throughholes and positive or negative electrode terminals are required to be formed, thereby to form a base plate 513 for the printed wiring board as shown in FIG. 7E. The base plate 513 thus obtained is sandwiched between resin plates 504 for preimpregnation each of which is coated with copper 512 at one surface thereof. In this case, etched portions 511 of the copper foil 503 are filled with the resin of the plates 504 for preimpregnation to form the body of a printed wiring board as shown in FIG. 7(F). At a fifth stage, throughholes 505, 506 and 507, as shown in FIG. 7G are formed in the body of the printed wiring board by an NC jigbowler or an NC press. The throughholes 505 are used as terminals for negative electrodes and the throughholes 506 are used as terminals for positive electrodes. At a sixth stage, copper coatings 512 are formed at the inner walls of the throughholes by the electroless copper plating method or the copper electroplating method, thereby to completely form the throughholes 510, the negative electrode terminals 508 and the positive electrode terminals 509. Thereafter, power supply lines for circuit elements and signal lines are patterned by a tenting method, a dry film method or the like so that the printed wiring board is completely produced as shown in FIG. 7H.

As shown in FIGS. 7A-7H, the printed wiring board according to this embodiment can be provided with positive and negative electrode terminals for power supply at the same surface of the printed wiring board, and therefore degree of freedom for circuit design can be improved. Further, according to the printed wiring board of this embodiment, miniaturization of the printed wiring board can be performed and noises can be reduced in the printed wiring board.

Figure 8:
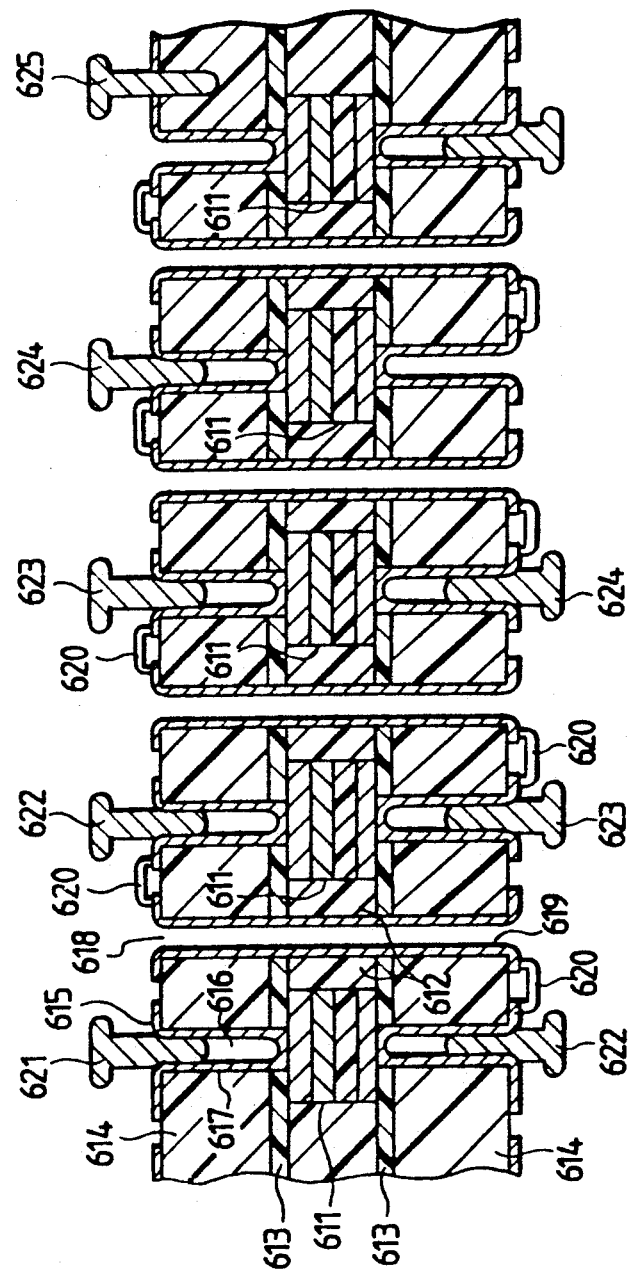
FIG. 8 is a cross sectional view of still another embodiment of the printed wiring board containing the sheet type storage battery.

FIG. 8 is a cross sectional view of a third embodiment of the printed wiring board containing a sheet type storage battery according to this invention.

The sheet type storage battery used in this embodiment has the substantially same structure as the first and second embodiments. That is, the sheet type storage battery includes a positive electrode layer comprising a composite material of $V_6O_{13}$ or the like, a solid electrolyte layer comprising a polymer electrolyte, a negative electrode layer comprising a metal foil of Li or Li-Al, and a collector layer comprising a metal foil of Ni which is laminated on the positive electrode layer. In this embodiment, plural sheet type storage batteries are disposed between spacers 612 so that those batteries and spacers are alternately aligned with one another at a constant interval in the horizontal direction, and laminated films 613 are adhered to the upper and lower surfaces of each of the sheet type storage batteries and the spacers to thereby form a base plate of a printed wiring board. Each of the laminated films comprises polyethylene, polystyrene, polyamide resin, phenol resin or epoxy resin. Further, prepregs are adhered to the laminated films 613 such that the plates sandwich the base plate as shown in FIG. 8. A circuit pattern of copper foil 615 is formed at the exposed portion of the preimpregnation plates 614 to thereby form the body of the printed wiring board. Each of the batteries can independently produce a voltage of 2.5 volts. Accordingly, when those batteries are connected in series, a voltage above 2.5 volts can be obtained.

Plural blind throughholes 616 each of which extends to the positive or negative electrode layers of each battery are formed in the plates 614 for preimpregnation and the laminated films 613. The inner walls of the blind throughholes 616 are coated with copper-plated layers(copper coating) 617. Further, throughholes 618 are formed in the printed wiring board at the position where the spacers 611 are embedded. The inner walls of the throughholes 618 are coated with copper-plated layers (copper coating) 619. The copper plated layers of the blind throughhole 616 and the copper plated layers of the throughhole 618 are insulated from each other. However, the gap between those copper foils is narrow and therefore those copper foils can be easily electrically connected to each other by a jumper wire 620 as shown in FIG. 8. Electrode terminals 621 to 625 for power supply are provided in the blind throughholes 616 such that those terminals are contacted with the copper-plated layers 617.

FIGS. 9A-9H schematically provide a method for producing the printed wiring board containing the sheet type storage battery as shown in FIG. 8.

At a first stage, plural spacers 612 are disposed on a laminated film 613 in the traverse direction of the laminated film 613, as shown in FIG. 9A, and then each of plural sheet type storage batteries 611, which is cut out so that it has the same shape as a gap between the spacers, is embedded in the gap as shown in FIG. 9B. At a second stage, a laminated film 613 is provided so that it covers the spacers 612 and the batteries 611, as shown in FIG. 9C, to form a base plate for the printed wiring board. At a third stage, two prepregs 614, each of which is coated with a copper foil 615 at one surface thereof, are provided on the laminated films 613 such that the copper foils 615 are exposed, as shown in FIG. 9D, and then are thermally fixedly attached to the base plate under pressure to thereby form the body of the printed wiring board. The laminated films 613 are used to improve adhesiveness among the spacers 612, the sheet type storage batteries 611 and the prepregs 614. At a fourth stage, blind throughholes 616 and throughholes 618, as shown in FIG. 9E are formed in the body of the printed wiring board by drill and punching processing techniques. At a fifth stage, the body of the printed wiring board is immersed in acid and alkali solutions to clean the blind throughholes 616 and the throughholes 618. In this case, the laminated resin portions disposed at the bottoms of blind throughholes 616 are eliminated and the metal portions are exposed. The body of the printed wiring board from which the metal portions are exposed is immersed in a seeder bath such as palladium tetrachloride($PdCl_4$), tin dichloride($SnCl_2$) or the like, and then the inner walls of the blind throughholes 616 and the throughholes 618 are coated with copper-plated layers 617 and 619 by the electroless copper plating or the copper electroplating as shown in FIG. 9F. At a sixth stage, a circuit pattern is formed on the body of the printed wiring board by the tenting method, the photolithography method or the like, as shown in FIG. 9G, and then the terminals 621 to 625 are provided in the blind throughholes as occasion demands.

The printed wiring board thus constructed is equipped with electrical parts by soft soldering like a conventional printed wiring board. If a throughhole for fixing the electrical parts to the board is required, the inner wall of the throughhole may be subjected to an insulation treatment.

According to the printed wiring board of this embodiment, an user can obtain power sources having various voltages by suitably connecting the copper foils at the throughholes 618 and the blind throughholes 616 with jumper wires or the like. For example, in the printed wiring board as shown in FIG. 8, the voltages of the terminals 622, 623, 624 and 625 are 2.5, 5, 7.5 and 10 volts, respectively, when the terminal 621 is kept at a reference potential( that is, the terminal 621 is grounded).

In this embodiment, since the plural sheet type storage batteries which are different in the amount of currents to be consumed are connected in series, attention should be given to the overcharge to a particular battery. To prevent the overcharge to the particular battery, the area of each of the sheet type storage batteries contained in the printed wiring board may be changed in accordance with the estimated amount of currents to be consumed by the battery.

According to the printed wiring board of this embodiment, plural power sources for providing different voltages can be effectively obtained without provision of plural batteries or condensers on the board, so that degree of freedom for circuit design is improved and the printed wiring board itself is miniaturized.

What is claimed is:

1. A printed wiring board for mounting circuit elements thereon, comprising:
   a base plate comprising at least one sheet type storage battery including a negative electrode layer, a positive electrode layer and a solid electrolyte layer sandwiched between said positive and negative electrode layers;
   preimpregnation plates laminated on both surfaces of said base plate; and
   holes formed in said printed wiring board for electrically connecting said positive and negative electrode layers to the circuit elements, said holes being coated with copper coating at the inner walls thereof.

2. A printed wiring board as claimed in claim 1, wherein said holes for said positive and negative electrode layers are formed at the same surface of said printed wiring board.

3. A printed wiring board as claimed in claim 1, wherein said base plate further comprises thermoplastic resin films laminated on the both surfaces of said base plate.

4. A printed wiring board as claimed in claim 2, wherein each of said thermoplastic resin films comprises a material selected from the group consisting of polyethylene, polystyrene, polyamide resin, phenol resin and epoxy resin.

5. A printed wiring board as claimed in claim 1, wherein said base plate further comprises a spacer attached to said negative electrode layer.

6. A printed wiring board as claimed in claim 1, wherein said base plate comprises plural sheet type storage batteries and plural spacers provided such that said sheet type storage batteries and said spacers are alternately arranged in a predetermined direction.

7. A printed wiring board as claimed in claim 6, wherein said base plate further comprises thermoplastic resin films laminated on both surfaces of each of said batteries and spacers.

8. A printed wiring board as claimed in claim 7, wherein each of said thermoplastic resin films comprises any material selected from the group consisting of polyethylene, polystyrene, polyamide resin, phenol resin and epoxy resin.

9. A printed wiring board as claimed in claim 8, further comprising throughholes formed in said printed wiring board at the position where said spacers are embedded.

10. A printed wiring board as claimed in claim 9, wherein said throughholes are coated with copper coating at the inner walls thereof.

11. A printed wiring board as claimed in claim 10, further comprising jumper wires connected between the copper coatings of said holes and said throughholes.

12. A printed wiring board as claimed in claim 10, further comprising electrode terminals provided in said holes in such a manner as to be contacted with the copper coating of said holes.

* * * * *